(12) United States Patent
Na et al.

(10) Patent No.: US 10,676,811 B2
(45) Date of Patent: Jun. 9, 2020

(54) METHOD OF MANUFACTURING DISPLAY DEVICE

(71) Applicant: SAMSUNG DISPLAY CO., LTD., Yongin-si, Gyeonggi-do (KR)

(72) Inventors: Heung Yeol Na, Suwon-si (KR); Dong Wook Kim, Hwaseong-si (KR); Jae Wan Seol, Hwaseong-si (KR); Seong Ho Jeong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 187 days.

(21) Appl. No.: 15/265,868

(22) Filed: Sep. 15, 2016

(65) Prior Publication Data

US 2017/0252774 A1    Sep. 7, 2017

(30) Foreign Application Priority Data

Mar. 7, 2016    (KR) .......................... 10-2016-0027199

(51) Int. Cl.
    *C23C 14/12*    (2006.01)
    *C23C 14/24*    (2006.01)
    *G06F 3/00*     (2006.01)
    *H01L 51/00*    (2006.01)

(52) U.S. Cl.
    CPC ............ *C23C 14/12* (2013.01); *C23C 14/243* (2013.01); *G06F 3/00* (2013.01); *H01L 51/001* (2013.01)

(58) Field of Classification Search
    CPC .......... C23C 14/12; C23C 14/243; G06F 3/00; H01L 51/001
    See application file for complete search history.

(56) References Cited

U.S. PATENT DOCUMENTS

| 2002/0081767 | A1* | 6/2002 | Kawashima | ............. C23C 14/12 438/99 |
| 2005/0023267 | A1* | 2/2005 | Timans    | ............. F27B 17/0025 219/405 |
| 2009/0146541 | A1* | 6/2009 | Nakahara  | ............. G02B 5/0808 313/113 |
| 2013/0291796 | A1* | 11/2013| Inoue     | ............. C23C 14/243 118/720 |

FOREIGN PATENT DOCUMENTS

| KR | 10-2014-0085092 A | 7/2014 |
| KR | 10-2015-0083066 A | 7/2015 |
| KR | 10-2015-0084297 A | 7/2015 |

* cited by examiner

*Primary Examiner* — James M Mellott
(74) *Attorney, Agent, or Firm* — Lewis Roca Rothgerber Christie LLP

(57) ABSTRACT

A method of manufacturing a display device is provided. A method of manufacturing a display device comprises preparing a thin film forming apparatus including a crucible, which stores a source material for forming a thin film, and a front heatsink, which is disposed on the crucible and includes a reflective plate, wherein the reflective plate has a first surface with a first reflectivity and a second surface with a second reflectivity, which is different from the first reflectivity; and forming a thin film on a substrate by evaporating the source material of the thin film forming apparatus.

17 Claims, 8 Drawing Sheets

METHOD OF MANUFACTURING DISPLAY DEVICE

CROSS-REFERENCE TO RELATED APPLICATION

Korean Patent Application No. 10-2016-0027199, filed on Mar. 7, 2016, in the Korean Intellectual Property Office, and entitled: "Thin Film Forming Apparatus and Method of Manufacturing Display Device Using the Same," is incorporated by reference herein in its entirety.

BACKGROUND

1. Field

The present disclosure relates to a thin film forming apparatus and a method of manufacturing a display device using the same.

2. Description of the Related Art

The importance of display devices has steadily grown with developments in multimedia technology. As a result, various display devices such as a liquid crystal display (LCD), an organic light-emitting diode (OLED) display, and the like have been developed and widespread.

A display device may be manufactured by depositing various thin films on a substrate. There is a method of forming a thin film on a substrate by evaporating a source material for forming a thin film to be deposited on a substrate.

SUMMARY

According to an exemplary embodiment of the present disclosure, a method of manufacturing a display device includes preparing a thin film forming apparatus including a crucible, which stores a source material for forming a thin film, and a front heatsink, which is disposed on the crucible and includes a reflective plate, wherein the reflective plate has a first surface with a first reflectivity and a second surface with a second reflectivity, which is different from the first reflectivity; and forming a thin film on a substrate by evaporating the source material of the thin film forming apparatus. The first reflectivity may be higher than the second reflectivity.

The first surface and the second surface may be formed of different materials.

The first reflective plate may be formed of a single material.

The first reflective plate may further have a mirror coating, which is formed on the first surface.

The roughness of the second surface may be higher than the roughness of the first surface.

The first reflectivity may be 90% or higher.

The second reflectivity may be 10% or lower.

The first surface may include a specular reflection surface, and the second surface may include a diffuse reflection surface.

The thin film forming apparatus may further include nozzles connected to the crucible, wherein the first reflective plate includes holes in which the nozzles are inserted.

The thin film forming apparatus may further include a cover plate overlapping the first reflective plate.

At least some of heat released from the crucible may be reflected by the first surface, and at least some of heat penetrating the first reflective plate and reflected by the cover plate may be absorbed by the second surface.

The front heatsink may further include a second reflective plate having a first surface with a third reflectivity and a second surface with a fourth reflectivity, which is different from the third reflectivity.

The third reflectivity may be higher than the fourth reflectivity.

The third reflectivity may be the same as the first reflectivity.

The third reflectivity may be different from the first reflectivity.

The thin film forming apparatus may further include a side heatsink disposed to be adjacent to sides of the crucible, wherein a first surface of the side heatsink has the first reflectivity.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
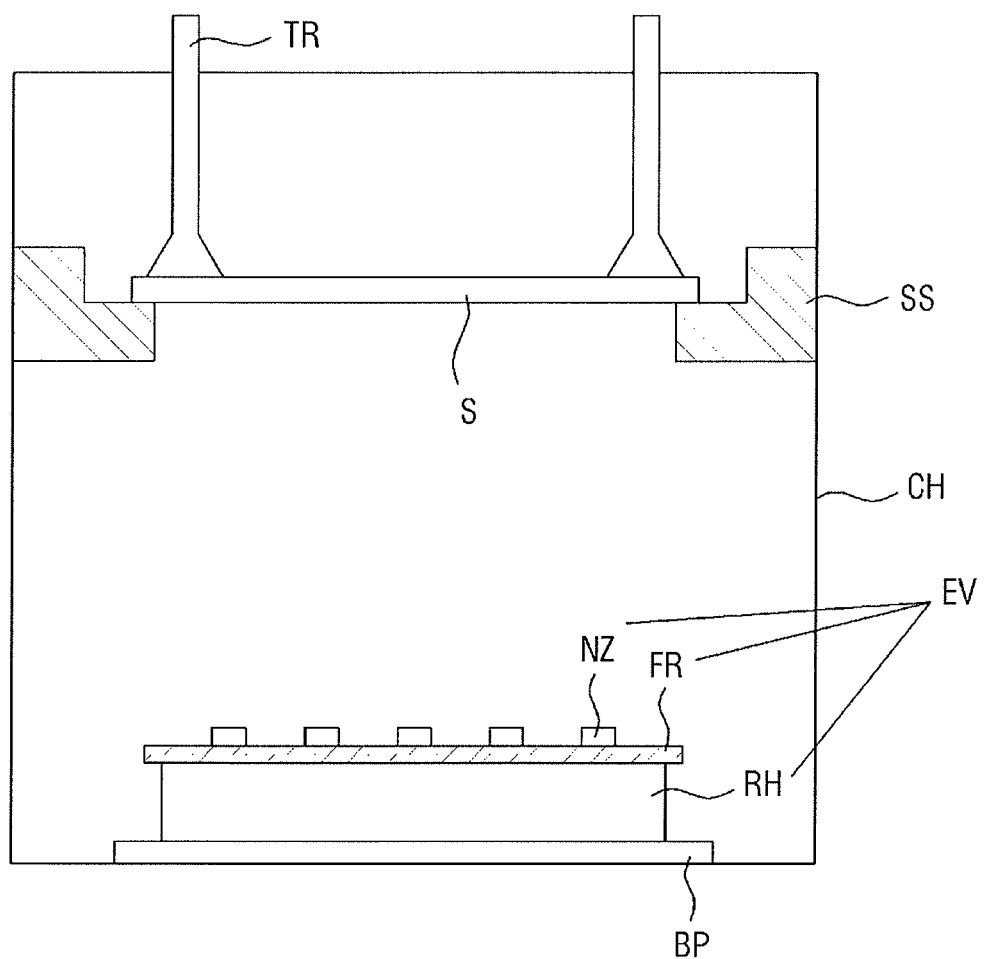
FIG. 1 illustrates a schematic cross-sectional view of a thin film forming apparatus according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The term "on" that is used to designate that an element is on another element or located on a different layer or a layer includes both a case where an element is located directly on another element or a layer and a case where an element is located on another element via another layer or still another element.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Exemplary embodiments of the present disclosure will hereinafter be described, taking a liquid crystal display (LCD) as an example, but the present disclosure is not limited thereto. That is, the present disclosure is also applicable to an organic light-emitting diode (OLED) display.

Figure 2:
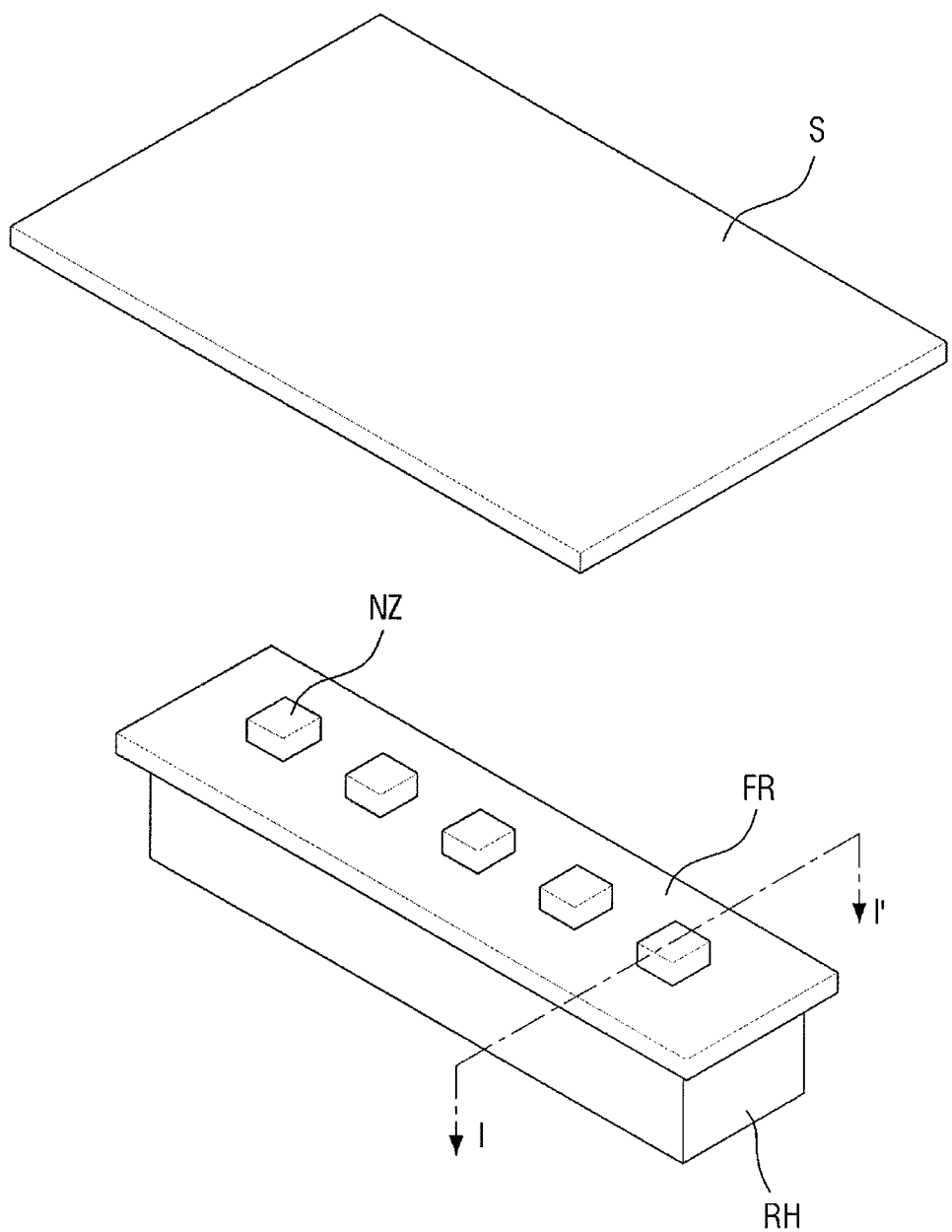
FIG. 2 illustrates a perspective view showing the relationship between some of the elements of the thin film forming apparatus according to the exemplary embodiment of FIG. 1.
Figure 3:
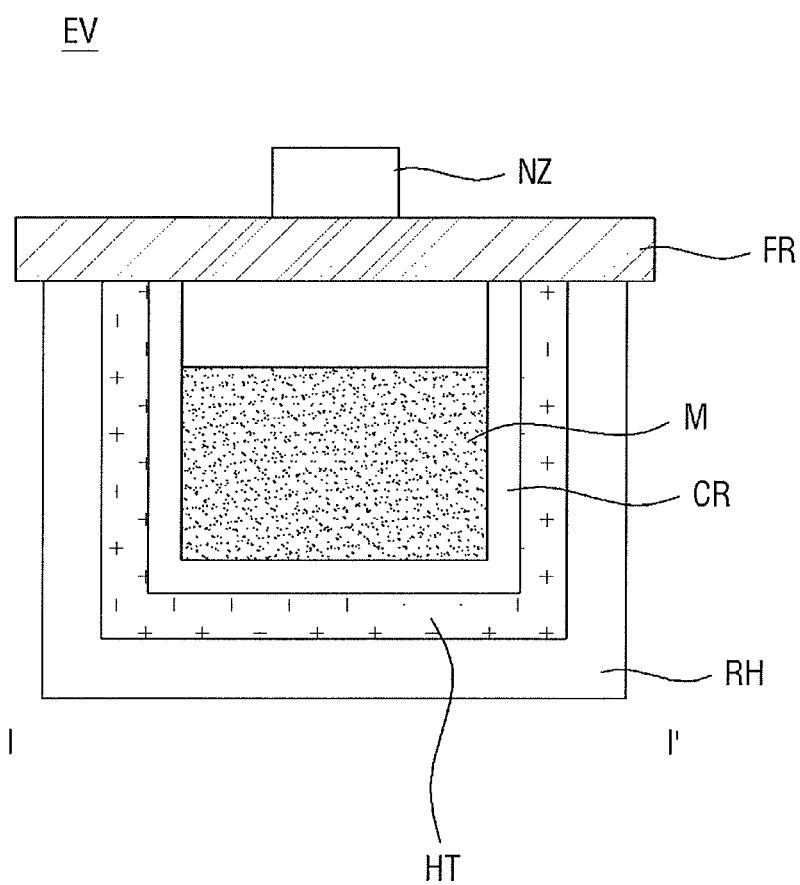
FIG. 3 illustrates a cross-sectional view taken along line I-I' of FIG. 2.

FIG. 1 is a schematic cross-sectional view of a thin film forming apparatus according to an exemplary embodiment of the present disclosure. FIG. 2 is a perspective view showing the relationship between some of the elements of the thin film foaming apparatus according to the exemplary embodiment of FIG. 1. FIG. 3 is a cross-sectional view taken along line I-I' of FIG. 2.

Referring to FIGS. 1 through 3, a thin film forming apparatus according to the present exemplary embodiment includes a deposition source EV having a crucible CR, which stores a source material M for forming a thin film, and a front heatsink FR on the crucible. The deposition source EV may also include a cooling housing RH and nozzles NZ. The front heat sink FR includes a reflective plate RP having a first surface with a first reflectivity and a second surface with a second reflectivity, which is different from the first reflectivity, as discussed below with reference to FIG. 4.

The thin film forming apparatus may further include a chamber CH. The chamber CH may have an inner space with a particular size. That is, the chamber CH may provide space for various elements that will be described later. The inner space of the chamber CH may be blocked from the outer space of the chamber CH. That is, the inner space of the chamber CH may be a sealed space. In other words, the inner space and the outer space of the chamber CH may be separated from each other, and the exchange of air therebetween may be blocked. However, the chamber CH may not necessarily be designed to be sealed, and may be configured to be provided with an inlet/outlet and thus to be able to be switched between a sealed mode and a ventilation mode.

The chamber CH may include a support substrate SS on which a substrate S, on which the thin film is to be formed using the material M, is to be mounted. The substrate S may be disposed on the support substrate SS to face the deposition source EV. Various devices may be disposed on the substrate S. Various masks may be disposed between the substrate S and the deposition source EV to form thin films having particular patterns on the substrate S. In particular, the substrate S may be supported at the edges thereof by a substrate support SS. The substrate support SS supports the edges of the substrate S while exposing a central part of the substrate S. Thus, the source material M provided by the deposition source EV may arrive at the central part of the substrate S and may thus form a thin film on the substrate S.

The chamber CH may include transport TR for transporting the substrate S. In an example, the transport TR may include robot arms or various chucks, but the present disclosure is not limited thereto. That is, the transport TR may include any device capable of putting the substrate S in and out of the chamber CH.

A base plate BP may be disposed in the chamber CH. The base plate BP supports the deposition source EV that will be described later.

In an example, the base plate BP may include a guide along which the deposition source EV moves. In this example, the deposition source EV may horizontally move along the guide in the base plate BP. In another example, the base plate BP may include a lift that vertically moves the deposition source EV. In this example, the base plate BP may be lifted or lowered vertically by the lift. When the base plate BP includes a guide for horizontally moving and/or lift for vertically moving the deposition source EV may be moved to, and disposed at, a suitable location for a process to be performed.

The deposition source EV may be disposed on the base plate BP. The deposition source EV will hereinafter be described with reference to FIG. 3. The deposition source EV may include the crucible CR, a heater HT, the cooling housing RH, nozzles NZ, and the front reflective plate FR.

The crucible CR may store a source material M for forming a thin film. In other words, the crucible CR may have space to store the source material M. In an example, the source material M may be an organic material. That is, the crucible CR may store an organic material, and thus, the thin film forming apparatus according to the present exemplary embodiment may form an organic film on a substrate S, which is a target object on which to form a thin film.

The heater HT may be disposed on the outside and/or the inside of the crucible CR. FIG. 3 illustrates an example in which the heater HT is on the outside of the crucible CR, but the location of the heater HT is not limited thereto. That is, in another example, the heater HT may be on the inside of the crucible CR.

The heater HT may provide heat to the crucible CR. More specifically, the heater HT may heat the crucible CR, and as a result, the source material M in the crucible CR may be heated. The heated source material M may be delivered to the substrate S, which is the target object on which to form a thin film, via the nozzles NZ that will be described later.

The heater HT may be an electron beam heater or a resistance coil heater, but the type of the heater HT is not limited thereto. That is, any heating means capable of providing heat necessary for the crucible CR may be used as the heater HT.

The heater HT may surround the sides and/or the bottom of the crucible CR. FIG. 3 illustrates an example in which the heater HT surrounds both the sides and the bottom of the crucible CR, but the location of the heater HT is not limited thereto. That is, in another example, the heater HT may be disposed to surround only the sides of the crucible CR or to surround only the bottom of the crucible CR. In still another example, the heater HT may be disposed adjacent to only some of the sides of the crucible CR.

The cooling housing RH may accommodate the crucible CR and the heater HT therein. More specifically, the cooling housing RH may be disposed to surround the crucible CR and the heater HT, and may provide space for the crucible CR and the heater HT.

The cooling housing RH may prevent heat generated by the heater HT from being released to outside the heater HT, i.e., the inner space of the chamber CH. In an example, the cooling housing RH may include cooling means for blocking heat generated by the heater HT. The cooling means may be, for example, a cooling channel, but the type of the cooling means is not limited thereto.

The front heatsink FR may be disposed on the crucible CR. The front heatsink FR may prevent heat from the heater HT, from the crucible CR heated by the heater HT, or from the source material M present in the heated crucible CR from being transmitted to the substrate S. The front heatsink FR will be described later in further detail.

The nozzles NZ may be disposed on the front heatsink FR. The nozzles NZ may connect the inside and the outside of the crucible CR. The nozzles NZ may include openings. The openings may be rectangular, circular, or semicircular, but the shape of the openings is not limited thereto. That is, the openings of the nozzles NZ may be formed in various shapes, other than those set forth herein.

FIG. 3 illustrates an example in which the nozzles NZ are rectangular, but the shape of the nozzles NZ is not limited thereto. That is, in another example, the nozzles NZ may be cylindrical.

The source material M present in the crucible CR may be delivered to the substrate S via the nozzles NZ. That is, the source material M that is evaporated may be sprayed and deposited onto the substrate S via the nozzles NZ, thereby forming a thin film.

FIGS. 2 and 3 illustrate an example in which a plurality of nozzles NZ are arranged in one direction, but the number and arrangement direction of the nozzles NZ are not limited thereto. That is, in another example, only one nozzle NZ may be provided. In still another example, the plurality of nozzles NZ may be arranged in a matrix having rows and columns.

Figure 4:
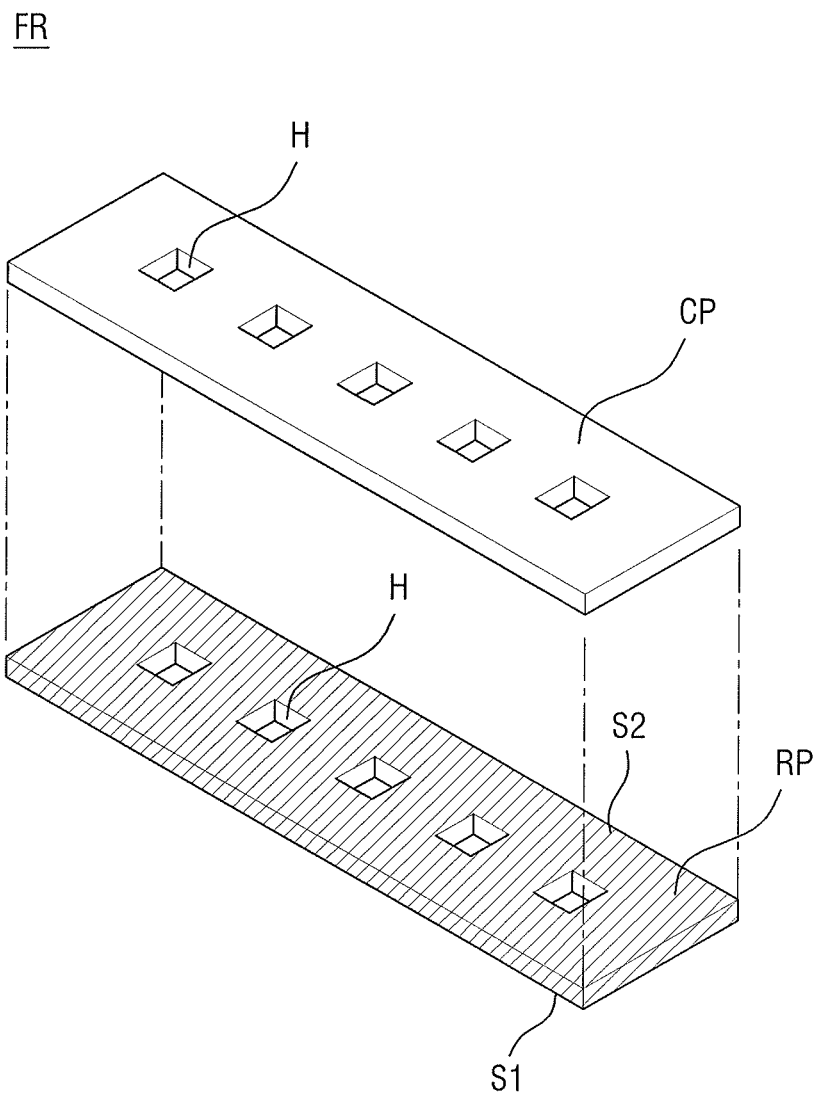
FIG. 4 illustrates an exploded perspective view of a front heatsink of the thin film forming apparatus according to the exemplary embodiment of FIG. 1.

The front heatsink FR will hereinafter be described with reference to FIG. 4. FIG. 4 is an exploded perspective view of a front heatsink of the thin film forming apparatus according to the exemplary embodiment of FIG. 1.

The front heatsink FR may include a reflective plate RP and a cover plate CP. The reflective plate RP and the cover plate CP may overlap, e.g., fully overlap, each other.

The reflective plate RP reflects and absorbs heat from the crucible CR, from the source material M, and/or from the heater HT. More specifically, the reflective plate RP reflects and absorbs radiant heat from the crucible CR, from the source material M, and/or from the heater HT.

The reflective plate RP may have a first surface S1, which faces the crucible CR, and a second surface S2, which faces a target object on which to form a thin film.

The first surface S1 may have a first reflectivity and the second surface S2 may have a second reflectivity. The first reflectivity and the second reflectivity may differ from each other. More specifically, the first reflectivity may be relatively higher than the second reflectivity. In an example, the reflective plate RP may be formed of two materials having different reflectivities. In other words, one of the two materials may form the first surface S1, and the other material may form the second surface S2. For example, the first material may be a metal and the second material may be a ceramic.

In another example, the reflective plate RP may be formed of a single material, and the surfaces of the reflective plate RP may be processed differently. For example, the single material may be a heat absorbing material, e.g., a ceramic, with a mirror coating on the first surface S1 so as to improve the reflectivity of the first surface S1, compared to the second surface S2. Alternatively, for example, the single material may be a heat reflective material, e.g., a metal, and the roughness of the second surface S2 may be increased, i.e., the second surface S2 may be roughened, and thus, the reflectivity of the second surface S2 may become relatively lower than the reflectivity of the first surface S1. That is, by making the roughness of the first surface S1 and the roughness of the second surface S2 differ from each other, the reflectivity of the first surface S1 and the reflectivity of the second surface S2 may be made to differ from each other. Thus, the second surface may provide more diffuse reflection than the first surface S1.

The greater the difference between the first reflectivity and the second reflectivity, the great the efficiency of the reuse of heat and the reduction in heat transmitted to the substrate S. In an example, the first reflectivity may be 90% or higher, and the second reflectivity may be 10% or lower. In other words, the first surface S1 may be highly reflective and the second surface S2 may be highly absorptive.

In an example, the type of reflection that occurs at the first surface S1 may differ from the type of reflection that occurs at the second surface S2. More specifically, specular reflection may occur at the first surface S1, and diffuse reflection may occur at the second surface S2. That is, the first surface S1 may include a specular reflection surface for efficiently reflecting heat transmitted from the crucible CR, and the second surface S2 may include a diffuse reflection surface for absorbing or diffusing heat reflected from the cover plate CP that will be described later.

The reflective plate RP may include a plurality of holes H. The nozzles NZ may be inserted into the holes H. That is, the nozzles NZ may be inserted into the reflective plate RP, and the reflective plate RP may cover the crucible CR. In other words, the front heatsink FR may serve as a lid for the crucible CR.

The reflective plate RP may comprise a metal material. In an example, the reflective plate RP may comprise stainless steel, but the material of the reflective plate RP is not limited thereto. That is, any reflective material such as a plastic material or the like may also be used to form the reflective plate RP.

The cover plate CP may be disposed on the reflective plate RP. The cover plate CP may cover the reflective plate RP. The cover plate CP may have substantially the same shape as the reflective plate RP. That is, if the holes H are formed in the reflective plate RP, a plurality of holes H may also be formed in the cover plate CP to overlap the holes H of the reflective plate RP. In other words, the nozzles NZ may be inserted into the holes H of each of the reflective plate RP and the cover plate CP that are laid over each other.

The cover plate CP may be formed of a metal material. In an example, the cover plate CP may include stainless steel, but the material of the cover plate CP is not limited thereto.

FIG. 4 illustrates an example in which the cover plate CP and the reflective plate RP are both rectangular, but the shape of the cover plate CP and the reflective plate RP is not limited thereto. That is, in another example, the cover plate CP and the reflective plate RP may be circular or may be partially curved.

Figure 5:
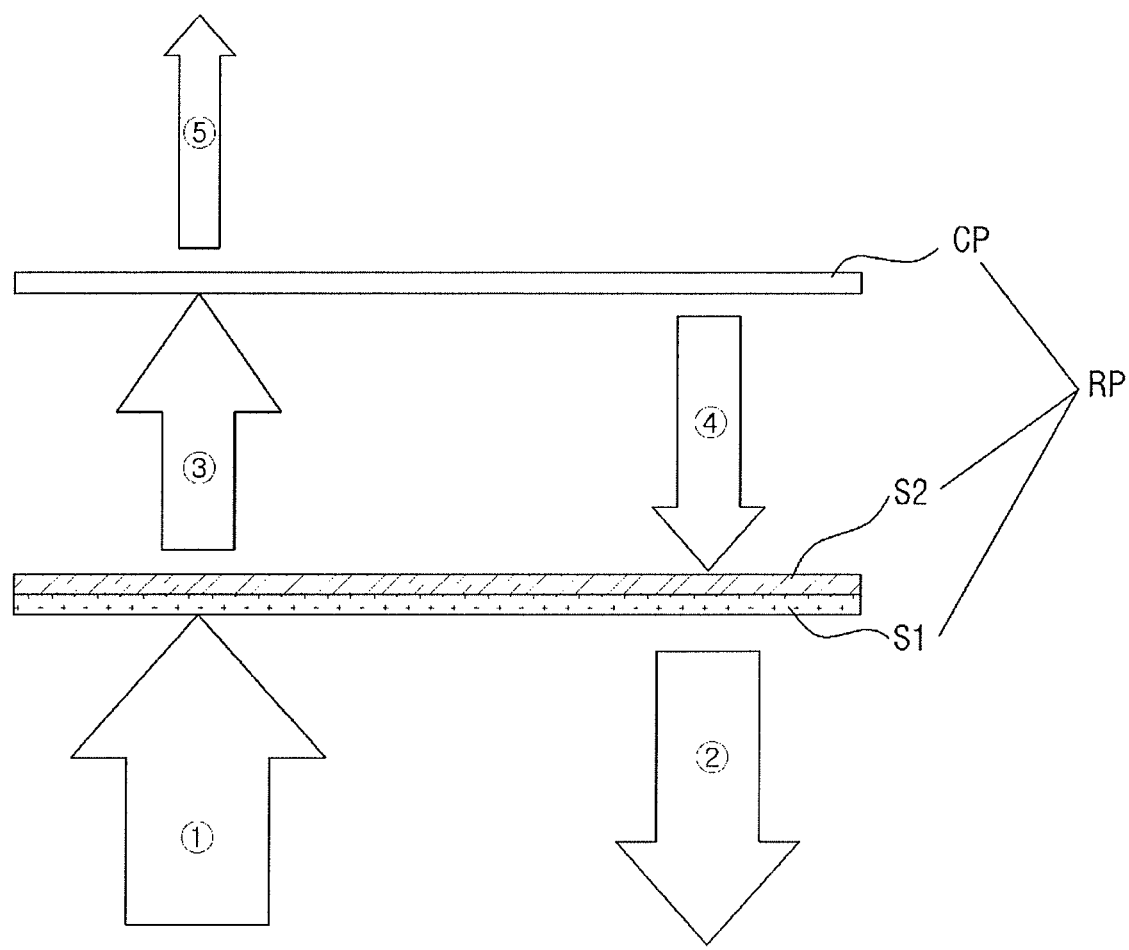
FIG. 5 illustrates a conceptual view of the flow of heat in the thin film forming apparatus according to the exemplary embodiment of FIG. 1.

The dissipation of heat by the front heatsink FR will hereinafter be described with reference to FIG. 5. FIG. 5 is a conceptual view illustrating the flow of heat in the thin film forming apparatus according to the exemplary embodiment of FIG. 1.

Referring to FIG. 5, some of heat ① released from the crucible CR, the source material M, or the heater HT may be reflected by the first surface S1 of the reflective plate RP. The reflected heat, i.e., heat ②, may be provided back to the crucible CR and may thus be reused.

Heat ③ penetrating the reflective plate RP may reach the cover plate CP. At least some of the heat ③ may be reflected by the cover plate CP to travel back toward the reflective plate RP. That is, the heat reflected by the cover plate CP, i.e., heat ④, may travel toward the second surface S2 of the reflective plate RP. At least some of the heat ④ may be absorbed by the second surface S2 of the reflective plate RP. As mentioned above, if the reflectivity of the second surface S2 of the reflective plate RP is lowered, in other words, if the absorptivity of the second surface of the reflective plate RP is increased, most of the heat ④ may be absorbed by the second surface S2 of the reflective plate RP. Thus, heat released from the crucible CR and the like can be prevented from being transmitted to the substrate S.

That is, only a fraction of heat released from the crucible CR and the like, i.e., only heat ⑤, may penetrate the front heatsink RP and travel into the chamber CH. FIG. 5 illustrates an example in which some of the heat released from the crucible CR and the like penetrates the cover plate CP, but the present disclosure is not limited thereto. That is, in another example, the heat released from the crucible CR and the like may be completely blocked.

Accordingly, the heat released from the crucible CR and the like can be reduced or prevented from being transmitted to the substrate S to cause damage to thin films formed on the substrate S or to degrade the properties of other elements on the substrate S.

A thin film forming apparatus according to another exemplary embodiment of the present disclosure will hereinafter be described.

Figure 6:
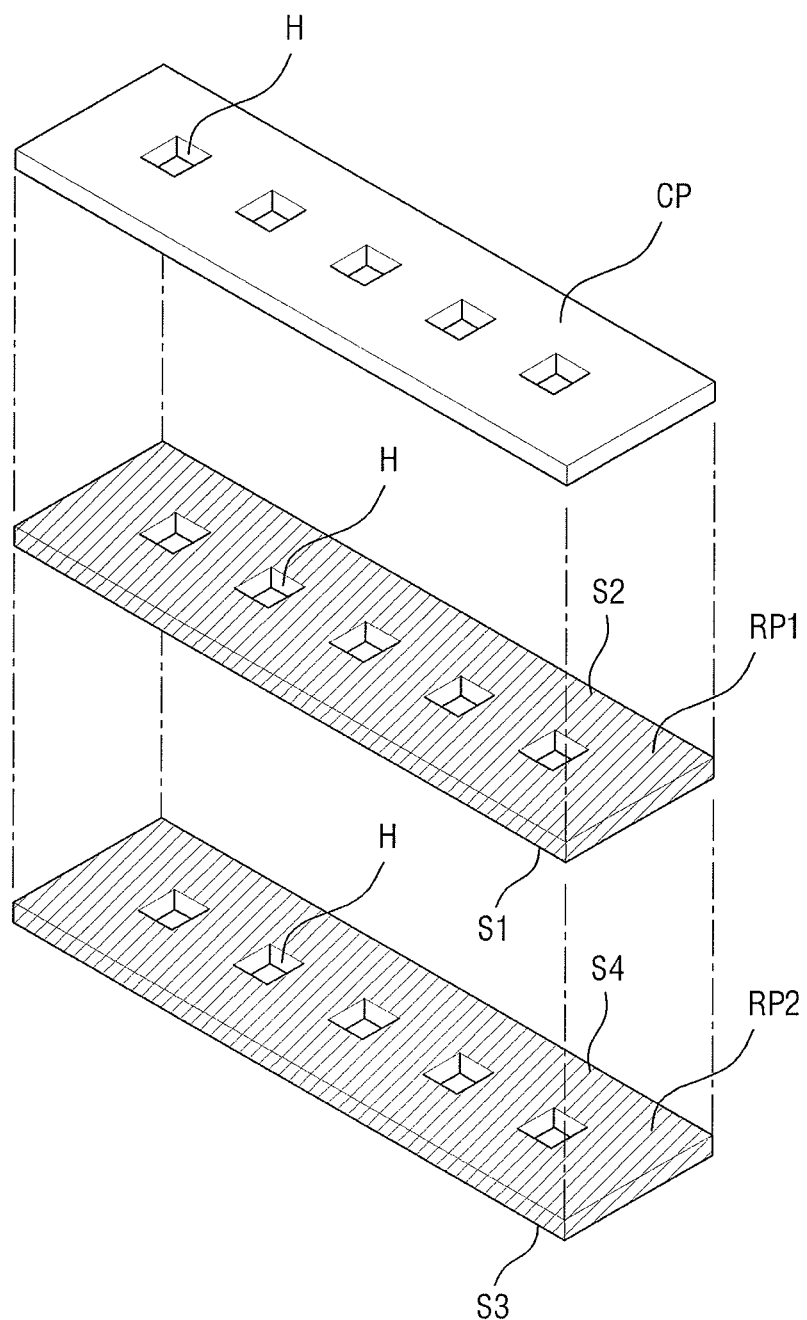
FIG. 6 illustrates an exploded perspective view of a front heatsink of a thin film forming apparatus according to another exemplary embodiment of the present disclosure.

FIG. 6 is an exploded perspective view of a front heatsink of a thin film forming apparatus according to another exemplary embodiment of the present disclosure. Referring to FIG. 6, a front heatsink FR of the thin film forming apparatus according to the present exemplary embodiment differs from its counterpart of FIG. 4 in that it includes a first reflective plate RP1 and a second reflective plate RP2.

The thin film foaming apparatus according to the present exemplary embodiment may include two or more reflective plates. FIG. 6 illustrates an example in which two reflective plates are provided, but the present disclosure is not limited thereto. That is, in another example, three or more reflective plates may be provided.

The first reflective plate RP1 and the second reflective plate RP2 may have substantially the same shape. The first reflective plate RP1 and the second reflective plate RP2 may be substantially the same as the reflective plate RP. That is, in an example, the first reflective plate RP1 may have a first surface S1 with a first reflectivity and a second surface S2 with a second reflectivity, and the second reflective plate RP2 may have a first surface S3 with the first reflectivity and a second surface S4 with the second reflectivity.

In another example, the first surface S1 of the first reflective plate RP1 and the first surface S3 of the second reflective plate RP2 may have different reflectivities. In other words, the first surface S1 and the second surface S2 of the first reflective plate RP1 may have a first reflectivity and a second reflectivity, respectively, and the first surface S3 and the second surface S4 of the second reflective plate RP2 may have a third reflectivity and a fourth reflectivity, respectively. The first reflectivity may be higher than the second reflectivity. The third reflectivity may be higher than the fourth reflectivity. The first reflectivity may be different from the third reflectivity.

In a case in which two reflective plates are provided, as illustrated in FIG. 6, heat released from a crucible CR and the like may be effectively blocked and may thus be prevented from being transmitted to a substrate S to cause damage to the substrate S.

Figure 7:
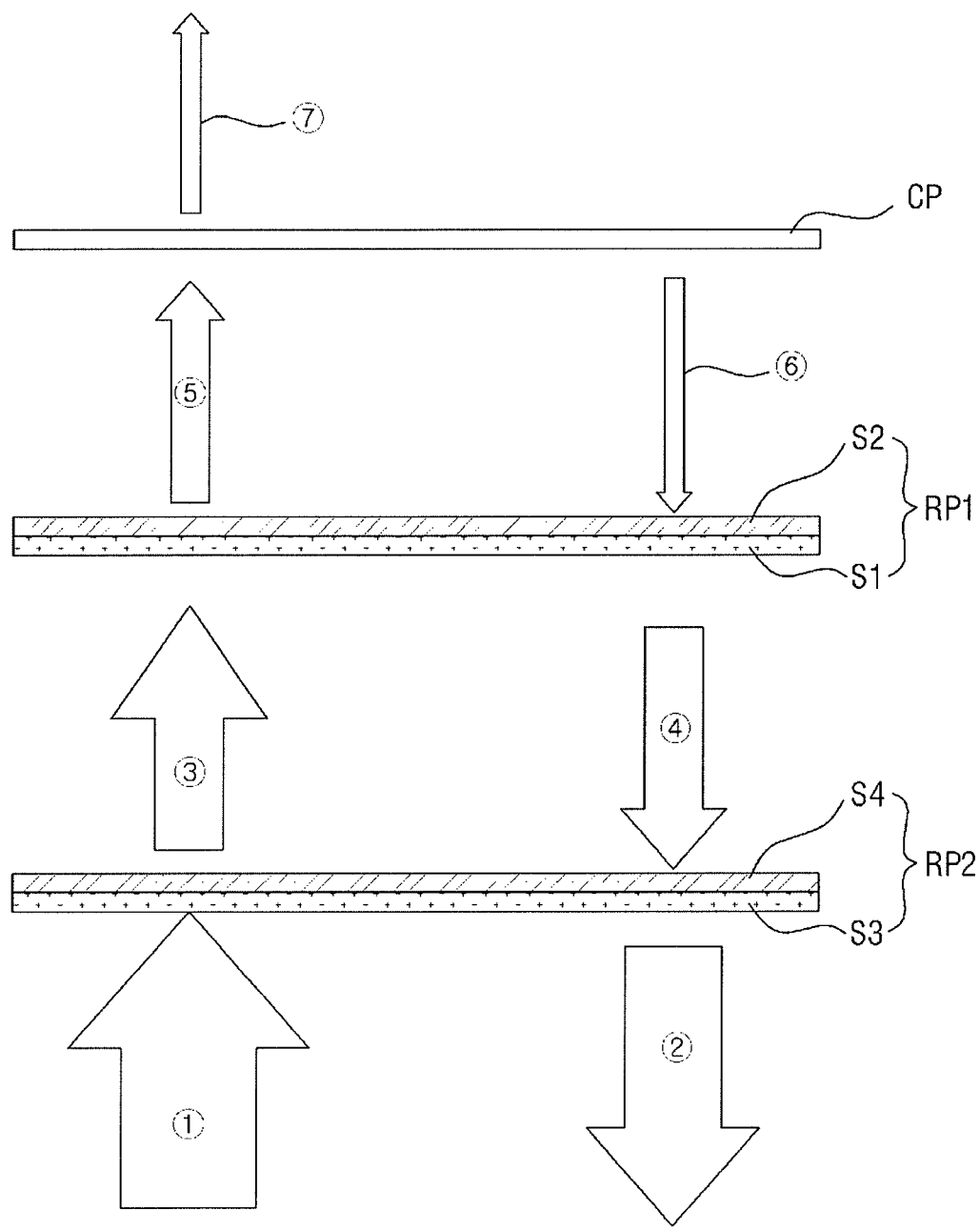
FIG. 7 illustrates a conceptual view illustrating the flow of heat in the thin film forming apparatus according to the exemplary embodiment of FIG. 6.

The dissipation of heat by the front heatsink FR of FIG. 6 will hereinafter be described with reference to FIG. 7. FIG. 7 is a conceptual view illustrating the flow of heat in the thin film forming apparatus according to the exemplary embodiment of FIG. 6.

Referring to FIG. 7, at least some of heat ① released from the crucible CR, a source material M for forming a thin film, or a heater HT may be reflected by the first surface S3 of the second reflective plate RP2. The reflected heat, i.e., heat ②, may be provided back to the crucible CR and may thus be reused.

Heat ③ penetrating the second reflective plate RP2 may reach the first surface S1 of the first reflective plate RP1. At least some of the heat ③, i.e., heat ④, may be reflected to travel back toward the second surface S4 of the second reflective plate RP2. At least some of the heat reaching the second surface S4 of the second reflective plate RP2 may be absorbed by the second surface S4 of the second reflective plate RP2. As mentioned above, if the reflectivity of the second surface S4 of the second reflective plate RP2 is lowered, in other words, if the absorptivity of the second surface S4 of the second reflective plate RP2 is increased, most of the heat ④ may be absorbed by the second surface S4 of the second reflective plate RP2.

At least some of the heat ③ penetrating the second reflective plate RP2 may also pass through the first reflective plate RP1. Heat ⑤ penetrating the first reflective plate RP1 may travel toward a cover plate CP.

At least some of the heat ⑤ penetrating the first reflective plate RP1 may be reflected to travel back toward the second surface S2 of the first reflective plate RP1. At least some of heat ⑥ reaching the second surface S2 of the first reflective plate RP1 may be absorbed by the second surface S2 of the first reflective plate RP1. As mentioned above, if the reflectivity of the second surface S2 of the first reflective plate RP1 is lowered, in other words, if the absorptivity of the second surface S2 of the first reflective plate RP1 is increased, most of the heat ⑥ reflected by the cover plate CP may be absorbed by the second surface S2 of the first reflective plate RP1.

That is, only a fraction of heat released from the crucible CR and the like, i.e., only heat ⑦, may penetrate the front heatsink RP and travel into the chamber CH. FIG. 7 illustrates an example in which some of the heat released from the crucible CR and the like penetrates the cover plate CP, but the present disclosure is not limited thereto. That is, in another example, the heat released from the crucible CR and the like may be completely blocked.

With the structure of the front heatsink FR of FIG. 6, the heat released from the crucible CR and the like can be prevented from being transmitted to the substrate S to adversely affect elements on the substrate S.

Figure 8:
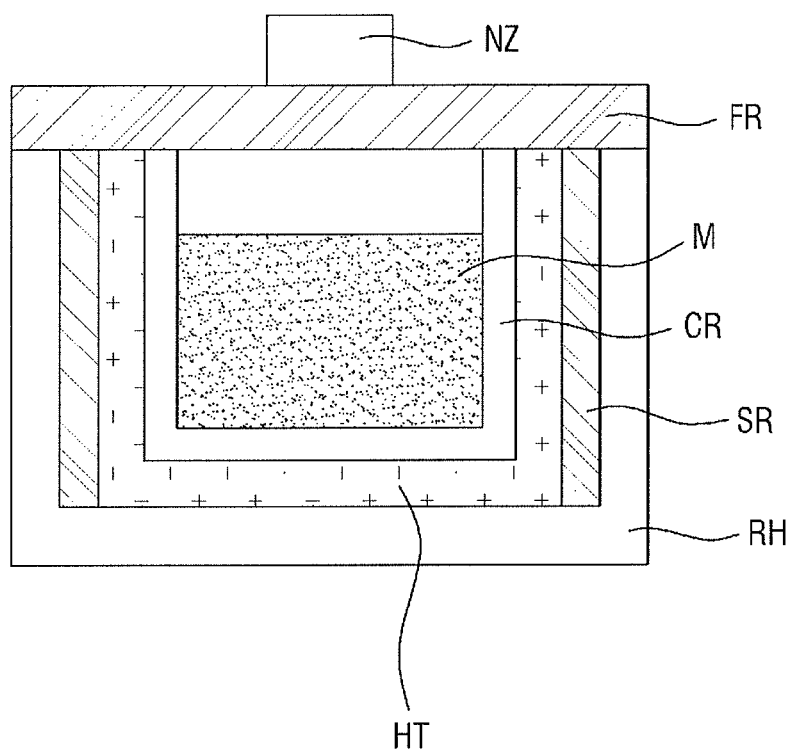
FIG. 8 illustrates a cross-sectional view of a thin film forming apparatus according to another exemplary embodiment of the present disclosure.

FIG. 8 is a cross-sectional view of a thin film forming apparatus according to another exemplary embodiment of the present disclosure. Referring to FIG. 8, the thin film forming apparatus according to the present exemplary embodiment differs from its counterpart of FIG. 3 in that it further includes a side heatsink SR.

The side heatsink SR may be disposed between a cooling housing RH and a crucible CR. The side heatsink SR may reflect heat released from a heater HT and may thus transmit the heat back to the crucible CR.

To reflect the heat released from the heater HT, a first surface of the side heatsink SR that faces the heater HT may be reflective.

In an example, the first surface and a second surface of the side heatsink SR may have different reflectivities. In other words, the side heatsink SR, like a front heatsink FR, may have a first surface with a first reflectivity and a second surface with a second reflectivity, which is different from the first reflectivity. Since the side heatsink SR is mainly for transmitting heat generated by the heater HT back to the crucible CR, the first reflectivity may be higher than the second reflectivity. That is, the first surface of the side heatsink SR may be formed to have an excellent reflectivity and may thus be able to transmit radiant heat from the heater HT back to the crucible CR.

A method of manufacturing a display device, according to an exemplary embodiment of the present disclosure, will hereinafter be described. The method includes: preparing a thin film forming apparatus including a crucible CR, which stores a source material M for forming a thin film, and a front heatsink FR, which is disposed on the crucible CR and includes a reflective plate RP, wherein the reflective plate RP has a first surface S1 with a first reflectivity and a second surface S2 with a second reflectivity, which is different from the first reflectivity; and placing the thin film forming apparatus to face a substrate S and forming a thin film on the substrate S by evaporating the source material M of the thin film forming apparatus.

The thin film forming apparatus may be substantially the same as any one of the thin film forming apparatuses that have been described above, and thus, a detailed description thereof will be omitted.

The substrate S may be, for example, a substrate for manufacturing an OLED display or an LCD, but the present disclosure is not limited thereto. That is, the type of the substrate S is not particularly limited.

In an example, the thin film formed on the substrate S by the thin film forming apparatus may include an organic material. That is, the source material M may be an organic material, and the thin film formed on the substrate S by the thin film forming apparatus may be an organic layer.

However, the present disclosure is not limited to this example. That is, in another example, the thin film formed on the substrate S by the thin film forming apparatus may include an inorganic material.

By way of summation and review, while evaporating a source material for forming a thin film to be deposited on a substrate can precisely form a thin film needed in a display device, such evaporation may cause damage to a substrate due to heat needed for the evaporation process. According to one or more exemplary embodiments, heat generated by a deposition source can be reduced or prevented from being transmitted to a substrate on which a thin film is to be formed. In addition, the heat generated by the deposition source can be blocked and can thus be reduced or prevented from causing damage to thin films formed on the substrate. One or more exemplary embodiments provide a thin film forming apparatus, which is capable of reducing or preventing heat generated by a deposition source from being transmitted to a substrate. One or more exemplary embodiments of provide a thin film forming apparatus, which is capable of efficiently blocking heat generated by a deposition source and thus preventing damage to thin films formed on a substrate. One or more exemplary embodiments may provide a method of manufacturing a display device, which is capable of reducing or preventing heat generated by a deposition source from being transmitted to a substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a display device, comprising:
preparing a thin film forming apparatus including a crucible, which stores a source material for forming a thin film, and a front heatsink, which is disposed on the crucible and includes a second reflective plate and a first reflective plate overlapping the second reflective plate, wherein the first reflective plate has a first surface with a first reflectivity and a second surface with a second reflectivity, which is lower than the first reflectivity, and the second reflective plate has a first surface with a third reflectivity and a second surface with a fourth reflectivity, which is different from the third reflectivity, wherein the first surface of the second reflective plate is an outermost surface of the second reflective plate and of the front heatsink and is closer to the crucible than the second surface of the first reflective plate is to the crucible; and
forming a thin film on a substrate by evaporating the source material of the thin film forming apparatus.

2. The method of claim 1, wherein:
the source material is an organic material; and
the thin film formed on the substrate is an organic layer.

3. The method of claim 1, wherein the first surface of the first reflective plate and the second surface of the first reflective plate are formed of different materials.

4. The method of claim 1, wherein the first reflective plate is formed of a single material.

5. The method of claim 1, wherein the first surface of the first reflective plate is a mirror coating.

6. The method of claim 1, wherein a roughness of the second surface of the first reflective plate is higher than a roughness of the first surface of the first reflective plate.

7. The method of claim 1, wherein the first surface includes a specular coating surface, and the second surface includes a diffuse reflection surface.

8. The method of claim 1, further comprising:
nozzles connected to the crucible,
wherein the first reflective plate includes holes in which the nozzles are inserted.

9. The method of claim 1, further comprising:
a cover plate overlapping the first reflective plate.

10. The method of claim 9, at least some of heat released from the crucible is reflected by the first surface of the first reflective plate; and
at least some of heat penetrating the first reflective plate and reflected by the cover plate is absorbed by the second surface of the first reflective plate.

11. The method of claim 1, wherein the third reflectivity is higher than the fourth reflectivity, and the first surface of the second reflective plate faces the crucible.

12. The method of claim 1, wherein the third reflectivity is the same as the first reflectivity.

13. The method of claim 1, wherein the third reflectivity is different from the first reflectivity.

14. The method of claim 1, further comprising:
a side heatsink disposed to be adjacent to sides of the crucible,
wherein a first surface of the side heatsink has the first reflectivity.

15. A method of manufacturing a display device, comprising:
preparing a thin film forming apparatus including a crucible, which stores a source material for forming a thin film, and a front heatsink, which is disposed on the crucible and includes a second reflective plate and a first reflective plate overlapping the second reflective plate, wherein the first reflective plate has a first surface with a first reflectivity and a second surface with a second reflectivity, which is different from the first reflectivity, the second reflectivity being more diffuse than the first reflectivity, and the second reflective plate has a first surface with a third reflectivity and a second surface with a fourth reflectivity, which is different from the third reflectivity, wherein the first surface of the second reflective plate is an outermost surface of the second reflective plate and of the front heatsink and is closer to the crucible than the second surface of the first reflective plate is to the crucible; and
forming a thin film on a substrate by evaporating the source material of the thin film forming apparatus.

16. The method as claimed in claim 15, wherein the first surface of the second reflective plate includes a specular reflection surface.

17. The method as claimed in claim 15, wherein the second surface of the second reflective plate includes a diffuse reflection surface.

* * * * *